(12) United States Patent
Alkan et al.

(10) Patent No.: US 8,487,717 B2
(45) Date of Patent: Jul. 16, 2013

(54) MULTIPATH MITIGATION CIRCUIT FOR HOME NETWORK

(75) Inventors: Erdogan Alkan, Fayetteville, NY (US); Raymond W. Palinkas, Canastota, NY (US)

(73) Assignee: PPC Broadband, Inc., East Syracuse, NY (US)

( * ) Notice: Subject to any disclaimer, the term of this patent is extended or adjusted under 35 U.S.C. 154(b) by 594 days.

(21) Appl. No.: 12/697,589

(22) Filed: Feb. 1, 2010

(65) Prior Publication Data

US 2011/0187481 A1    Aug. 4, 2011

(51) Int. Cl.
*H03H 7/06* (2006.01)

(52) U.S. Cl.
USPC .......................................................... 333/175

(58) Field of Classification Search
USPC ............................ 333/168, 175, 176; 455/307
See application file for complete search history.

(56) References Cited

U.S. PATENT DOCUMENTS

| | | |
|---|---|---|
| 3,790,909 A | 2/1974 | LeFevre |
| 3,939,431 A | 2/1976 | Cohlman |
| 4,027,219 A | 5/1977 | Van Alphen et al. |
| 4,306,403 A | 12/1981 | Hubbard et al. |
| 4,344,499 A | 8/1982 | Van der Lely et al. |
| 4,512,033 A | 4/1985 | Schrock |
| 4,520,508 A | 5/1985 | Reichert, Jr. |
| 4,648,123 A | 3/1987 | Schrock |
| 4,677,390 A | 6/1987 | Wagner |
| 4,715,012 A | 12/1987 | Mueller, Jr. |
| 4,961,218 A | 10/1990 | Kiko |
| 4,982,440 A | 1/1991 | Dufresne et al. |
| 5,010,399 A | 4/1991 | Goodman et al. |
| 5,126,686 A | 6/1992 | Tam |
| 5,126,840 A | 6/1992 | Dufresne et al. |

(Continued)

FOREIGN PATENT DOCUMENTS

| | | | |
|---|---|---|---|
| JP | 55-080989 A | 6/1980 | |
| JP | 55-132126 A | 10/1980 | |

(Continued)

OTHER PUBLICATIONS

U.S. Appl. No. 13/245,510, filed Sep. 26, 2011, Wells.

(Continued)

*Primary Examiner* — Benny Lee
*Assistant Examiner* — Gerald Stevens
(74) *Attorney, Agent, or Firm* — Schmeiser, Olsen & Watts LLP

(57) ABSTRACT

A filter circuit is provided having multipath interference mitigation. The filter includes a signal path extending from an input to an output. The signal path includes a conductive path and a ground. A pass band filter is disposed along the signal path between the input and the output. The pass band filter passes a first frequency spectrum in a provider bandwidth, and attenuates a second frequency spectrum in a home network bandwidth. The filter circuit further includes a multipath interference mitigation leg operatively branched from the signal path. The multipath interference mitigation leg increases a return loss of the home network bandwidth. A frequency response of the filter circuit is characterized by an insertion loss characteristic between the input and the output being less than 3 dB in the provider bandwidth, and more than 20 dB in the home network bandwidth. The frequency response is further characterized by a return loss characteristic at the output being more than 10 dB in the provider bandwidth and home network bandwidth.

13 Claims, 6 Drawing Sheets

U.S. PATENT DOCUMENTS

| | | | |
|---|---|---|---|
| 5,214,505 | A | 5/1993 | Rabowsky et al. |
| 5,231,660 | A | 7/1993 | West, Jr. |
| 5,369,642 | A | 11/1994 | Shioka et al. |
| 5,485,630 | A | 1/1996 | Lee et al. |
| 5,548,255 | A | 8/1996 | Spielman |
| 5,557,319 | A | 9/1996 | Gurusami et al. |
| 5,557,510 | A | 9/1996 | McIntyre et al. |
| 5,719,792 | A | 2/1998 | Bush |
| 5,740,044 | A | 4/1998 | Ehrenhardt et al. |
| 5,745,836 | A | 4/1998 | Williams |
| 5,745,838 | A | 4/1998 | Tresness et al. |
| 5,815,794 | A | 9/1998 | Williams |
| 5,839,052 | A | 11/1998 | Dean et al. |
| 5,893,024 | A | 4/1999 | Sanders et al. |
| 5,937,330 | A | 8/1999 | Vince et al. |
| 5,950,111 | A | 9/1999 | Georger et al. |
| 5,970,053 | A | 10/1999 | Schick et al. |
| 6,012,271 | A | 1/2000 | Wilkens et al. |
| 6,014,547 | A | 1/2000 | Caporizzo et al. |
| 6,049,693 | A | 4/2000 | Baran et al. |
| 6,069,960 | A | 5/2000 | Mizukami et al. |
| 6,094,211 | A | 7/2000 | Baran et al. |
| 6,101,932 | A | 8/2000 | Wilkens |
| 6,128,040 | A | 10/2000 | Shinbori et al. |
| 6,129,187 | A | 10/2000 | Bellanger et al. |
| 6,173,225 | B1 | 1/2001 | Stelzle et al. |
| 6,185,432 | B1 | 2/2001 | Vembu |
| 6,205,138 | B1 | 3/2001 | Nihal et al. |
| 6,229,375 | B1 | 5/2001 | Koen |
| 6,348,837 | B1 | 2/2002 | Ibelings |
| 6,348,955 | B1 | 2/2002 | Tait |
| 6,373,349 | B2 | 4/2002 | Gilbert |
| 6,377,316 | B1 | 4/2002 | Mycynek et al. |
| 6,388,539 | B1 | 5/2002 | Rice |
| 6,425,132 | B1 | 7/2002 | Chappell |
| 6,430,904 | B1 | 8/2002 | Coers et al. |
| 6,495,998 | B1 | 12/2002 | Terreault |
| 6,498,925 | B1 | 12/2002 | Tauchi |
| 6,510,152 | B1 | 1/2003 | Gerszberg et al. |
| 6,546,705 | B2 | 4/2003 | Scarlett et al. |
| 6,550,063 | B1 | 4/2003 | Matsuura |
| 6,560,778 | B1 | 5/2003 | Hasegawa |
| 6,570,928 | B1 | 5/2003 | Shibata |
| 6,587,012 | B1 | 7/2003 | Farmer et al. |
| 6,622,304 | B1 | 9/2003 | Carhart |
| 6,640,338 | B1 | 10/2003 | Shibata |
| 6,678,893 | B1 | 1/2004 | Jung |
| 6,683,513 | B2 | 1/2004 | Shamsaifar et al. |
| 6,725,462 | B1 | 4/2004 | Kaplan |
| 6,728,968 | B1 | 4/2004 | Abe et al. |
| 6,737,935 | B1 | 5/2004 | Shafer |
| 6,757,910 | B1 | 6/2004 | Bianu |
| 6,758,292 | B2 | 7/2004 | Shoemaker |
| 6,804,828 | B1 | 10/2004 | Shibata |
| 6,843,044 | B2 | 1/2005 | Clauss |
| 6,845,232 | B2 | 1/2005 | Darabi |
| 6,868,552 | B1 | 3/2005 | Masuda et al. |
| 6,877,166 | B1 | 4/2005 | Roeck et al. |
| 6,920,614 | B1 | 7/2005 | Schindler et al. |
| 6,928,175 | B1 | 8/2005 | Bader et al. |
| 6,942,595 | B2 | 9/2005 | Hrazdera |
| 7,003,275 | B1 | 2/2006 | Petrovic |
| 7,029,293 | B2 | 4/2006 | Shapson et al. |
| 7,039,432 | B2 | 5/2006 | Strater et al. |
| 7,048,106 | B2 | 5/2006 | Hou |
| 7,127,734 | B1 | 10/2006 | Amit |
| 7,162,731 | B2 | 1/2007 | Reidhead et al. |
| 7,254,827 | B1 | 8/2007 | Terreault |
| 7,283,479 | B2 | 10/2007 | Ljungdahl et al. |
| 7,399,255 | B1 | 7/2008 | Johnson et al. |
| 7,404,355 | B2 | 7/2008 | Viaud et al. |
| 7,416,068 | B2 | 8/2008 | Ray et al. |
| 7,454,252 | B2 | 11/2008 | El-Sayed |
| 7,464,526 | B2 | 12/2008 | Coenen |
| 7,505,819 | B2 | 3/2009 | El-Sayed |
| 7,508,284 | B2 | 3/2009 | Shafer |
| 7,530,091 | B2 | 5/2009 | Vaughan |
| 7,592,883 | B2 | 9/2009 | Shafer |
| 7,675,381 | B2 | 3/2010 | Lin |
| 7,742,777 | B2 | 6/2010 | Strater et al. |
| 2001/0016950 | A1 | 8/2001 | Matsuura |
| 2002/0141347 | A1 | 10/2002 | Harp et al. |
| 2002/0144292 | A1 | 10/2002 | Uemura et al. |
| 2002/0166124 | A1 | 11/2002 | Gurantz et al. |
| 2002/0174423 | A1 | 11/2002 | Fifield et al. |
| 2003/0084458 | A1 | 5/2003 | Ljungdahl et al. |
| 2004/0147273 | A1 | 7/2004 | Morphy |
| 2004/0172659 | A1 | 9/2004 | Ljungdahl et al. |
| 2004/0229561 | A1 | 11/2004 | Cowley et al. |
| 2005/0034168 | A1 | 2/2005 | Beveridge |
| 2005/0047051 | A1 | 3/2005 | Marland |
| 2005/0144649 | A1 | 6/2005 | Bertonis |
| 2005/0183130 | A1 | 8/2005 | Sadja et al. |
| 2005/0283815 | A1 | 12/2005 | Brooks et al. |
| 2005/0289632 | A1 | 12/2005 | Brooks et al. |
| 2006/0015921 | A1 | 1/2006 | Vaughan |
| 2006/0041918 | A9 | 2/2006 | Currivan et al. |
| 2006/0191359 | A1 | 8/2006 | Tarasinski et al. |
| 2006/0205442 | A1 | 9/2006 | Phillips et al. |
| 2006/0241838 | A1 | 10/2006 | Mongiardo et al. |
| 2006/0282871 | A1 | 12/2006 | Yo |
| 2007/0024393 | A1 | 2/2007 | Forse et al. |
| 2007/0288981 | A1 | 12/2007 | Mitsuse et al. |
| 2007/0288982 | A1 | 12/2007 | Donahue |
| 2008/0001645 | A1 | 1/2008 | Kuroki |
| 2008/0022344 | A1 | 1/2008 | Riggsby |
| 2008/0040764 | A1 | 2/2008 | Weinstein et al. |
| 2008/0120667 | A1 | 5/2008 | Zaltsman |
| 2008/0127287 | A1 | 5/2008 | Alkan et al. |
| 2008/0157898 | A1 | 7/2008 | Palinkas et al. |
| 2008/0168518 | A1 | 7/2008 | Hsue et al. |
| 2008/0247401 | A1 | 10/2008 | Bhal et al. |
| 2008/0247541 | A1 | 10/2008 | Cholas et al. |
| 2008/0271094 | A1 | 10/2008 | Kliger et al. |
| 2008/0313691 | A1 | 12/2008 | Cholas et al. |
| 2009/0031391 | A1 | 1/2009 | Urbanek |
| 2009/0047917 | A1 | 2/2009 | Phillips et al. |
| 2009/0077608 | A1 | 3/2009 | Romerein et al. |
| 2009/0153263 | A1 | 6/2009 | Lin |
| 2009/0165070 | A1 | 6/2009 | McMullin et al. |
| 2009/0180782 | A1 | 7/2009 | Bernard et al. |
| 2009/0217325 | A1 | 8/2009 | Kliger et al. |
| 2009/0320086 | A1 | 12/2009 | Rijssemus et al. |
| 2010/0017842 | A1 | 1/2010 | Wells |
| 2010/0095344 | A1 | 4/2010 | Newby et al. |
| 2010/0100918 | A1 | 4/2010 | Egan, Jr. et al. |
| 2010/0125877 | A1 | 5/2010 | Wells et al. |
| 2010/0146564 | A1 | 6/2010 | Halik et al. |
| 2010/0194489 | A1 | 8/2010 | Kearns et al. |
| 2010/0225813 | A1 | 9/2010 | Hirono et al. |
| 2011/0051014 | A1 | 3/2011 | Wang et al. |
| 2011/0069740 | A1 | 3/2011 | Cowley et al. |
| 2011/0072472 | A1 | 3/2011 | Wells et al. |
| 2011/0181371 | A1 | 7/2011 | Alkan |
| 2011/0258677 | A1 | 10/2011 | Shafer |
| 2012/0054805 | A1 | 3/2012 | Shafer et al. |
| 2012/0054819 | A1 | 3/2012 | Alkan et al. |
| 2012/0081190 | A1* | 4/2012 | Rijssemus ............... 333/25 |
| 2012/0159556 | A1 | 6/2012 | Alkan |
| 2012/0331501 | A1 | 12/2012 | Shafer |

FOREIGN PATENT DOCUMENTS

| | | |
|---|---|---|
| JP | 58-99913 | 12/1981 |
| JP | 57-091055 A | 6/1982 |
| JP | 58-101582 A | 6/1983 |
| JP | 59026709 | 8/1984 |
| JP | 61-157035 A | 7/1986 |
| JP | 05-191416 A | 7/1993 |
| JP | 07-038580 A | 2/1995 |
| JP | 11-069334 A | 3/1999 |
| JP | 2001-177580 | 6/2001 |
| JP | 2004-080483 | 3/2004 |
| JP | 2005-005875 | 1/2005 |
| JP | 2007-166109 A | 6/2007 |
| JP | 2007-166110 A | 6/2007 |
| WO | 0024124 A1 | 4/2000 |

| | | | |
|---|---|---|---|
| WO | 0172005 | A1 | 9/2001 |
| WO | 0233969 | A1 | 4/2002 |
| WO | 02091676 | A1 | 11/2002 |

OTHER PUBLICATIONS

PCT/US2010/049568 International Search Report May 31, 2011.

Wells, Cable Television Entry Adapter, U.S. Appl. No. 13/245,510, filed Sep. 26, 2011.

Wells, Passive Multi-Port Entry Adapter and Method for Preserving Downstream CATV Signal Strength within In-Home Network, U.S. Appl. No. 12/563,719, filed Sep. 21, 2009, Office Action Summary, dated Mar. 6, 2012.

Newby, Ingress Noise Inhibiting Network Interface Device and Method For Cable Television Networks, U.S. Appl. No. 12/250,229, filed Oct. 13, 2008, Office Action Summary, dated Jan. 23, 2012.

Egan, Multi-Port Entry Adapter, Hub and Method for Interfacing a CATV Network and a MoCA Network, U.S. Appl. No. 12/255,008, filed Oct. 21, 2008, Office Action Summary, dated Nov. 11, 2011.

* cited by examiner

MULTIPATH MITIGATION CIRCUIT FOR HOME NETWORK

FIELD OF THE INVENTION

The present invention relates generally to an electronic filter assembly for use in the cable television (CATV) industry, and more specifically to a circuit assembly that mitigates home data network signals from reflecting within a user's network.

BACKGROUND OF THE INVENTION

In many data distribution networks, electrical signals conveying information propagate along transmission lines across distances and through splitting devices. For example, in a cable television (CATV) network, media content propagates downstream from a head-end facility toward media devices located in various facilities such as homes and businesses. Along the way, the electrical signals conveying the media content propagate along main trunks, through taps, and along multiple branches that ultimately distribute the content to drop cables at respective facilities. The drop cable, which may be a single coaxial cable, typically is connected to a splitting device having two or more outlet ports. Distribution cables connected to the outlet ports route the signals to various rooms, often extending to one or more media devices. The network of distribution cables, splitters, and distribution points is referred to as a drop system.

A typical data distribution network provides many content selections to a user's media devices within the drop system, such as one or more televisions equipped with set top boxes or cable modems. Content selection propagated on a downstream bandwidth of the CATV system may include broadcast television channels, video on demand services, internet data, home security services, and voice over internet (VOIP) services. The content selections are typically propagated in a discrete frequency range, or channel, that is distinct from the frequency ranges of other content selections. Downstream bandwidth includes frequencies typically ranging from 50-1,000 megahertz (MHz).

The typical data distribution network is a two-way communication system. The downstream bandwidth carries signals from the head end to the user and an upstream bandwidth carries upstream signals from the user to the head end. Upstream bandwidth may include data related to video on demand services, such as video requests and billing authorization; internet uploads, such as photo albums or user account information; security monitoring; or other services predicated on signals or data emanating from a subscriber's home. Upstream bandwidth frequencies typically range from 7-49 MHz.

A user data network, or home network, may be coupled to the cable television network via the same coaxial cable delivering the downstream and upstream bandwidth of the CATV system. Often, the user data network is a home entertainment network providing multiple streams of high definition video and entertainment. Examples of home networking technologies include Ethernet, HomePlug, HPNA, and 802.11n. In another example, the user data network may employ technology standards developed by the Multimedia over Coax Alliance (MoCA). The MoCA standards promote networking of personal data utilizing the existing coaxial cable that is already wired throughout the user premises. MoCA technology provides the backbone for personal data networks of multiple wired and wireless products including voice, data, security, home heating/cooling, and video technologies. In such an arrangement, the cable drop from the cable system operator shares the coaxial line or network connection with MoCA-certified devices such as a broadband router or a set top box. The operators use coaxial wiring already existing within the home or business to interconnect the wired and wireless MoCA devices by directly connecting them to the coaxial jacks throughout the premises. MoCA technology delivers broadband-caliber data rates exceeding 130 Mbps, and supports as many as sixteen end points.

A MoCA-certified device such as the broadband router interconnects other MoCA-certified components located within the premises, for example additional set top boxes, routers and gateways, bridges, optical network terminals, computers, gaming systems, display devices, printers, network-attached storage, and home automation such as furnace settings and lighting control. The home network allows distribution and sharing of data or entertainment content among the MoCA-connected devices. For example, a high definition program recorded on a set top box in the living room may be played back by a second set top box located in a bedroom. And, a high definition movie recorded on a camcorder and stored on a user's personal computer may be accessed and displayed through any of the set top boxes within the premises. The home network may also allow high-definition gaming between rooms.

The home network may utilize an open spectrum bandwidth on the coaxial cable to transmit the personal data content, such as entertainment content. For example, a cable system operator may utilize a bandwidth of frequencies up to 1002 MHz, and a satellite system operator may utilize a bandwidth of frequencies from 1550-2450 MHz. The unused range of frequencies in this example, or open spectrum bandwidth, is 1002-1550 MHz. In another example, the open spectrum bandwidth may be higher than 2450 MHz. In one particular example, the Multimedia over Coax Alliance specifies an open spectrum, or home network bandwidth, of 1125-1525 MHz. A home network utilizing the open spectrum bandwidth does not interfere with any of the bandwidth being utilized by the cable television or satellite services provider.

An exemplary filter designed for use in a MoCA network is installed at the point of entry to a premises to allow MoCA transmissions to propagate throughout the home network while preventing the them from interfering with adjacent subscribers in the CATV network. Thus, the MoCA filter passes signals in the provider bandwidth and attenuates signals in the home network bandwidth. One problem noted with existing MoCA filters attenuating the home network spectrum is multipath interference. Multipath interference, or distortion, is a phenomenon in the physics of waves in which a wave from a transmitter travels to a receiver via two or more paths and, under the right conditions, two or more of the wave components interfere. The interference arises due to the wave components having travelled a different path defined by diffraction and the geometric length. The differing speed results in the wave components arriving at the receiver out of phase with each other. Multipath interference is a common cause of "ghosting" in analog television broadcasts, and is exacerbated in a MoCA network because the MoCA standard requires very high transmission energy (e.g., low power loss in the MoCA bandwidth). This high transmission power results in greater reflections at the ports of devices.

SUMMARY OF THE INVENTION

A filter circuit is provided having multipath interference mitigation. In one aspect of the invention, the filter includes a signal path extending from an input to an output. The signal path includes a conductive path and a ground. A pass band filter is disposed along the signal path between the input and the output. The pass band filter passes a first frequency spectrum in a provider bandwidth, and attenuates a second frequency spectrum in a home network bandwidth. The filter circuit further includes a multipath interference mitigation leg operatively branched from the signal path. The multipath interference mitigation leg increases a return loss of the home network bandwidth. A frequency response of the filter circuit is characterized by an insertion loss characteristic between the input and the output being less than 3 dB in the provider bandwidth, and more than 20 dB in the home network bandwidth. The frequency response is further characterized by a return loss characteristic at the output being more than 10 dB in the provider bandwidth and home network bandwidth.

In one aspect of the invention, the multipath interference mitigation leg is terminated to ground.

In a further aspect of the invention, the multipath interference mitigation leg is terminated to ground and includes an absorptive circuit.

In a further aspect of the invention, the absorptive circuit is a Chebyshev filter circuit.

In another aspect of the invention, the multipath interference mitigation leg is branched in parallel with the pass band filter.

In a further aspect of the invention, the multipath interference mitigation leg is branched in parallel with the pass band filter and includes an attenuator portion.

In a further aspect of the invention, the attenuator portion is a Tee-type resistive attenuator.

In another aspect of the invention, the frequency response of the circuit is further characterized by the return loss at the output and the input being more than 20 dB in the provider bandwidth and home network bandwidth.

BRIEF DESCRIPTION OF THE DRAWINGS

For a further understanding of the invention, reference will be made to the following detailed description of the invention which is to be read in connection with the accompanying drawing, wherein.

DETAILED DESCRIPTION OF THE INVENTION

Figure 1:
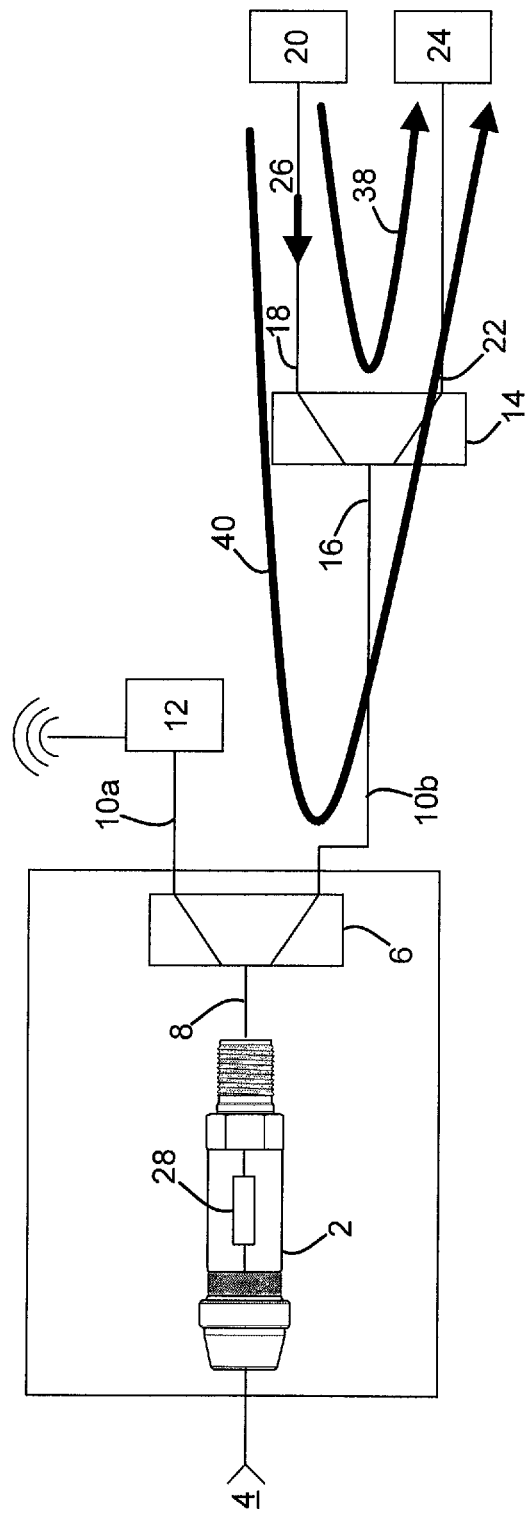
FIG. 1 schematically illustrates a portion of a home network.

Referring to FIG. 1, a portion of an exemplary home network includes a filter housing 2 located at the point of entry to a premises. In the disclosed embodiment, the filter housing 2 is a standard female f-connector configured to pass a provider bandwidth 4, which may be a CATV system, for example. An exemplary CATV system typically includes a downstream component and an upstream component. The provider bandwidth 4 may propagate a downstream bandwidth in the 50-1,000 MHz range, and also carry an upstream bandwidth in the 7-49 MHz range.

The provider bandwidth 4 passes through a MoCA-enabled splitter 6 having an input port 8 and two distribution ports 10a, 10b respectively. In one example, distribution port 10a is coupled via coaxial cable to a MoCA-enabled device 12 such as a wireless router. Distribution port 10b is coupled to a second MoCA-enabled splitter 14. The second splitter 14 likewise includes an input port 16, a second distribution port 18 connected to a second MoCA-enabled second device 20, such as a set top box, and a third distribution port 22 connected to a third MoCA-enabled third device 24, such as another set top box.

The second splitter 14 is adapted to freely transmit data on a home network bandwidth 26 from any port to any other port. For example, data on the home network bandwidth 26 may be transmitted from the second distribution port 18 to the third distribution port 22. In another example, data may be transmitted in an upstream direction from the first set top box 20 to the second distribution port 18 and through the second input port 16, through the distribution port 10b, then in a downstream direction through distribution port 10a to the wireless router 12. The data may include voice transmission, security, home heating/cooling instructions, and high definition video technologies, for example. The home network bandwidth 26 occupies an open spectrum bandwidth, that is, a frequency range outside the provider bandwidth 4. Referring to the exemplary CATV system above, the home network bandwidth 26 may carry signals in the 1125-1525 MHz range.

In the disclosed embodiment, the filter housing 2 includes internal filter circuitry to secure the home network bandwidth 26 from leaking upstream to other houses on the CATV network, thus protecting the privacy of the home network. One example of the internal filter circuitry, commonly referred to as a point-of-entry or MoCA filter 28, is described in U.S. patent application Ser. No. 12/501,041 entitled "FILTER CIRCUIT", which is incorporated herein by reference in its entirety.

Two important characteristics which determine the performance of the signals carried by the coaxial device are insertion loss and return loss. Insertion loss refers to the amount of attenuation the signal receives as it passes from the input to the output. Return loss refers to a measure of the reflected energy from the transmitted signal. The loss value is a negative logarithmic number expressed in decibels (dB) however, as used herein, the negative sign is dropped. Thus, a filter circuit initially having a loss characteristic of 1 dB that is improved to 20 dB improves (or decreases) the reflected signal level from about 80% to about 1%. As a rule of thumb, a 3 dB loss reduces power to one half, 10 dB to one tenth, 20 dB to one hundredth, and 30 dB to one thousandth. Therefore, the larger the insertion loss characteristic, the less energy that is lost passing through the circuit. The larger the return loss characteristic, the less energy that is reflected. Multipath return losses can be generated from splitters, coaxial cable, or point-of-entry filters, for example.

Figure 2:
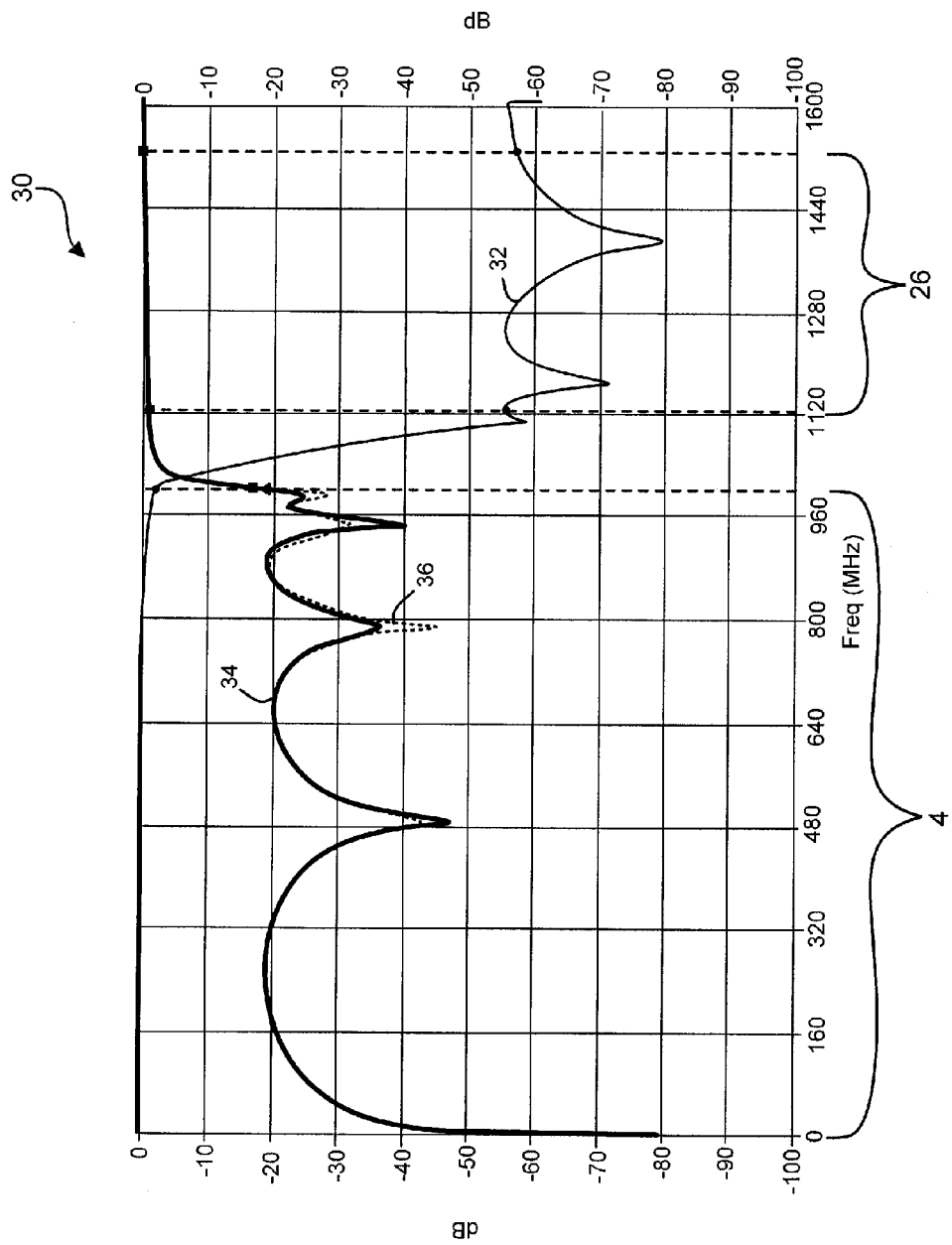
FIG. 2 is a chart showing the insertion loss and input/output return loss for a filter circuit within the home network depicted in FIG. 1.

Referring to FIG. 2, a frequency response 30 of the exemplary MoCA filter 28 includes an insertion loss 32 between the connector input and the connector output. The insertion loss 32 trace can be interpreted to mean that signals in the provider bandwidth 4 (5 MHz-1002 MHZ) are permitted to pass through the connector, while the signals in the home network bandwidth 26 (1125 MHz-1525 MHz) are attenuated or blocked. The frequency response 30 further includes an input return loss 34 or reflection at the connector input port, and an output return loss 36 or reflection at the connector output port. The return losses 34, 36 are greater than about 20 dB in the pass band, or provider bandwidth 4, but are approximately 1 dB in the stop band, or home network bandwidth 26.

Although the return losses 34, 36 may be adequate in the provider bandwidth 4, very high reflections may be experienced in the home network bandwidth 26. Multipath distortions may be generated from the poor return loss produced from the filters stop band. Referring now back to FIG. 1, a primary transmission path 38 may be defined by data (such as high definition programming) propagating on the home network bandwidth 26 from the first set top box 20 in an upstream direction to the second distribution port 18 on the MoCA-enabled splitter 14, then in a downstream direction through the third distribution port 22 where it is received by the second set top box 24. In this example, data would also propagate from the second distribution port 18 through the second input port 16, through the distribution port 10*b*, and would be attenuated at the MoCA filter 28 in the filter housing 2. However, because the output return loss 36 is approximately 1 dB within the home network bandwidth 26, almost all the power is reflected and a secondary transmission path 40 sets up for the reflected signal. The data propagating along the secondary transmission path 40 arrives at the receiver (e.g., set top box 24) out of synch with the data in the primary transmission path 38, and multipath interference results.

Figure 3:
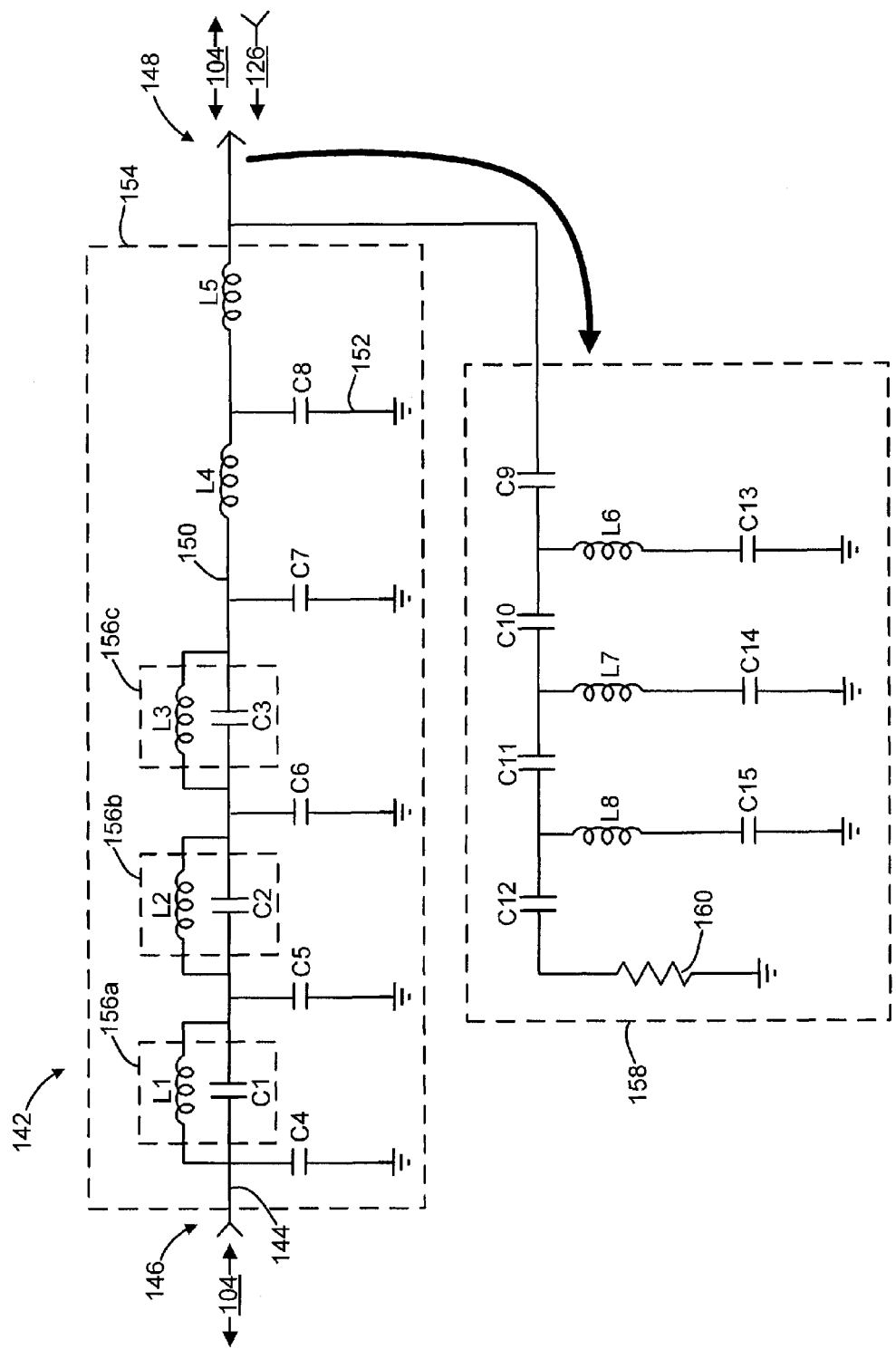
FIG. 3 is a circuit diagram, in schematic form, of one embodiment of a filter in accordance with the present invention.

Referring to FIG. 3 of the drawings, wherein like numerals indicate like elements from FIGS. 1 and 2, one possible topology for an embodiment of an improved filter circuit 142 is provided that reduces the multipath interference experienced with prior MoCA filters. The filter circuit 142 includes a signal path 144 extending from an input 146 to an output 148. In one example, the input 146 is connected to the input port of the filter housing, which may be, in turn, in electrical communication with a supplier-side port such as a tap port (not shown). The output 148 may be adapted to receive signals comprising the provider bandwidth 104, the home network bandwidth 126, noise, and any other signals present on the coaxial cable. Conversely, the input 146 may be connected to the user-side port and the output 148 may be connected to the supplier-side port.

The signal path 144 includes a conductive path 150, such as the center conductor in a coaxial cable, to carry the upstream bandwidth, the downstream bandwidth, and the home network bandwidth. The signal path 144 further includes a ground 152, such as the outer sheath of the coaxial cable that provides a path to ground with various cable connector devices.

The filter circuit 142 further includes a pass band filter portion 154 disposed along the signal path 144 between the input 146 and the output 148. The pass band filter portion 154 is configured to pass a first frequency spectrum in the provider bandwidth 104 and attenuate a second frequency spectrum in the home network bandwidth 126. In one embodiment, the pass band filter portion 154 is a hybrid parallel inductor/capacitor (LC) arrangement in which inductors L4 and L5, along with capacitor C8, increase the isolation of the low pass filter. Resonator or tank elements 156*a*-156*c* defined by L1/C1, L2/C2, and L3/C3 and capacitive shunts C4, C5, C6, and C7 collectively form an elliptic filter. Other filter designs, such as Butterworth, are equally operable but may require additional components to implement.

The filter circuit 142 further includes a multipath interference mitigation leg 158 operatively branched to ground from the signal path 144. The multipath interference mitigation leg 158 is configured to increase the return loss in the home network bandwidth. In the embodiment shown in FIG. 3, the multipath interference mitigation leg 158 is an absorptive Chebyshev filter circuit that increases the return loss at the output port of the connector without affecting the frequency response of the remaining circuit. The absorptive circuit includes a first lumped element comprising capacitors C9 and C10 in series, with an inductor/capacitor (LC) series connection of L6/C13 shunted to ground at a node between C9 and C10. The absorptive circuit further includes a second lumped element comprising capacitors C10 and C11 in series, with an inductor/capacitor (LC) series connection of L7/C14 shunted to ground at a node between C10 and C11. The absorptive circuit further includes a third lumped element comprising capacitors C11 and C12 in series, with an inductor/capacitor (LC) series connection of L8/C15 shunted to ground at a node between C11 and C12. A termination resistor 160 may be configured to match the impedance of the line load so as to prevent reflections due to impedance mismatch. In the illustrated example, the line load is 75 ohms, and the termination resistor 160 is likewise 75 ohms.

Figure 4:
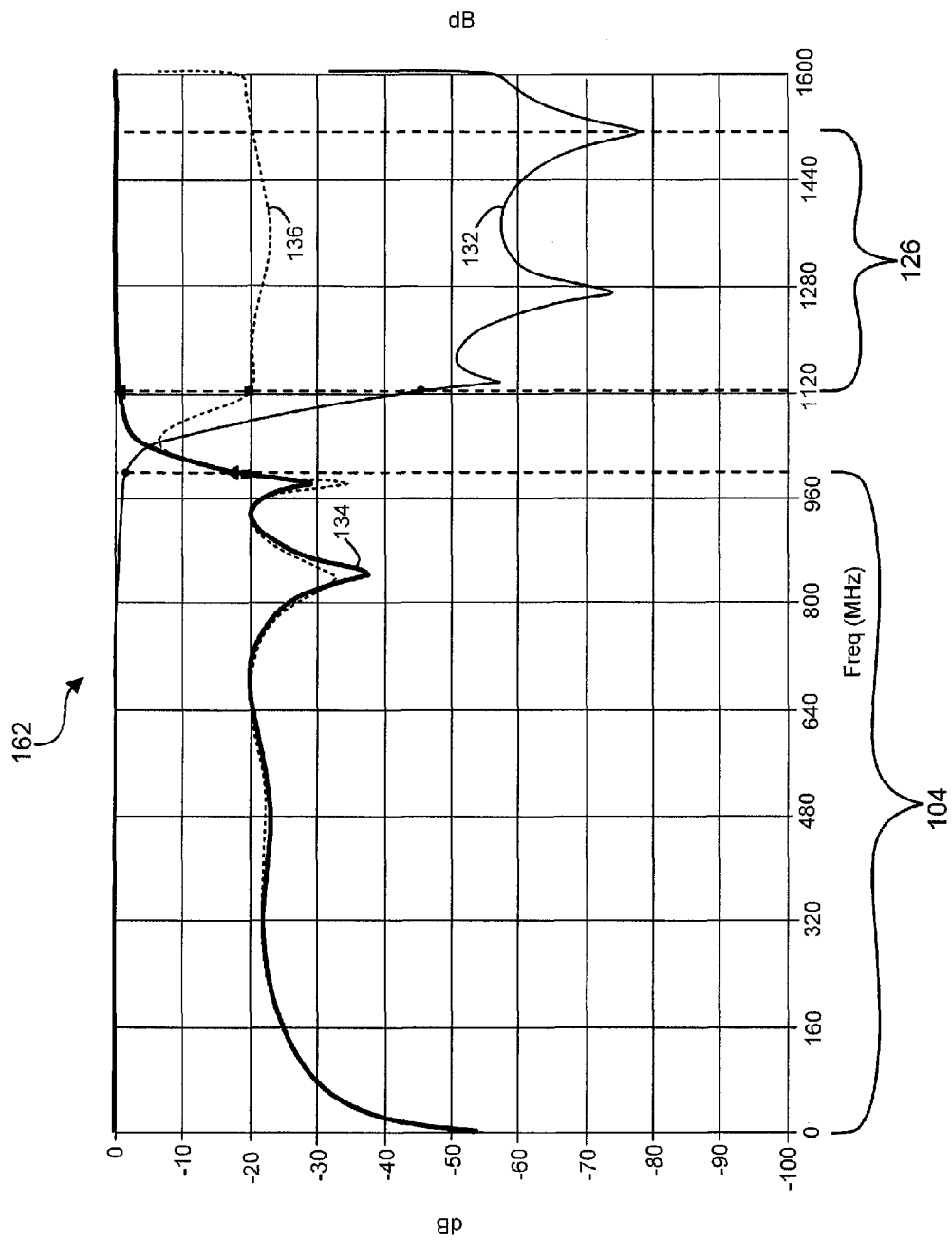
FIG. 4 is a chart showing the insertion loss and input/output return loss for the filter circuit shown in FIG. 3.

FIG. 4 plots the frequency response 162 of the filter circuit 142 shown in FIG. 3. The insertion loss 132 between the connector input and the connector output is essentially zero in the provider bandwidth 104, and greater than 50 dB in the home network bandwidth 126. Thus, the filter circuit 142 will pass the signals in the provider bandwidth 104 and attenuate the signals in the home network bandwidth 126. The input return loss 134 is essentially unchanged in that the loss of greater than 20 dB in the provider bandwidth 104 will reduce reflections from the input port of the connector. One noted improvement of the filter circuit 142 is that the output return loss 136 of the circuit is improved to greater than 20 dB in both the provider bandwidth 104 and the home network bandwidth 126. In this manner, reflections at the output port are reduced and the strength of the secondary transmission path (described in FIG. 1) will be reduced by as much as 99%. Although a return loss value of more than 20 dB is disclosed, the inventors have discovered that the return loss at the output may be more than 10 dB in the provider bandwidth and home network bandwidth, and the filter circuit of the present invention will still perform adequately.

Figure 5:
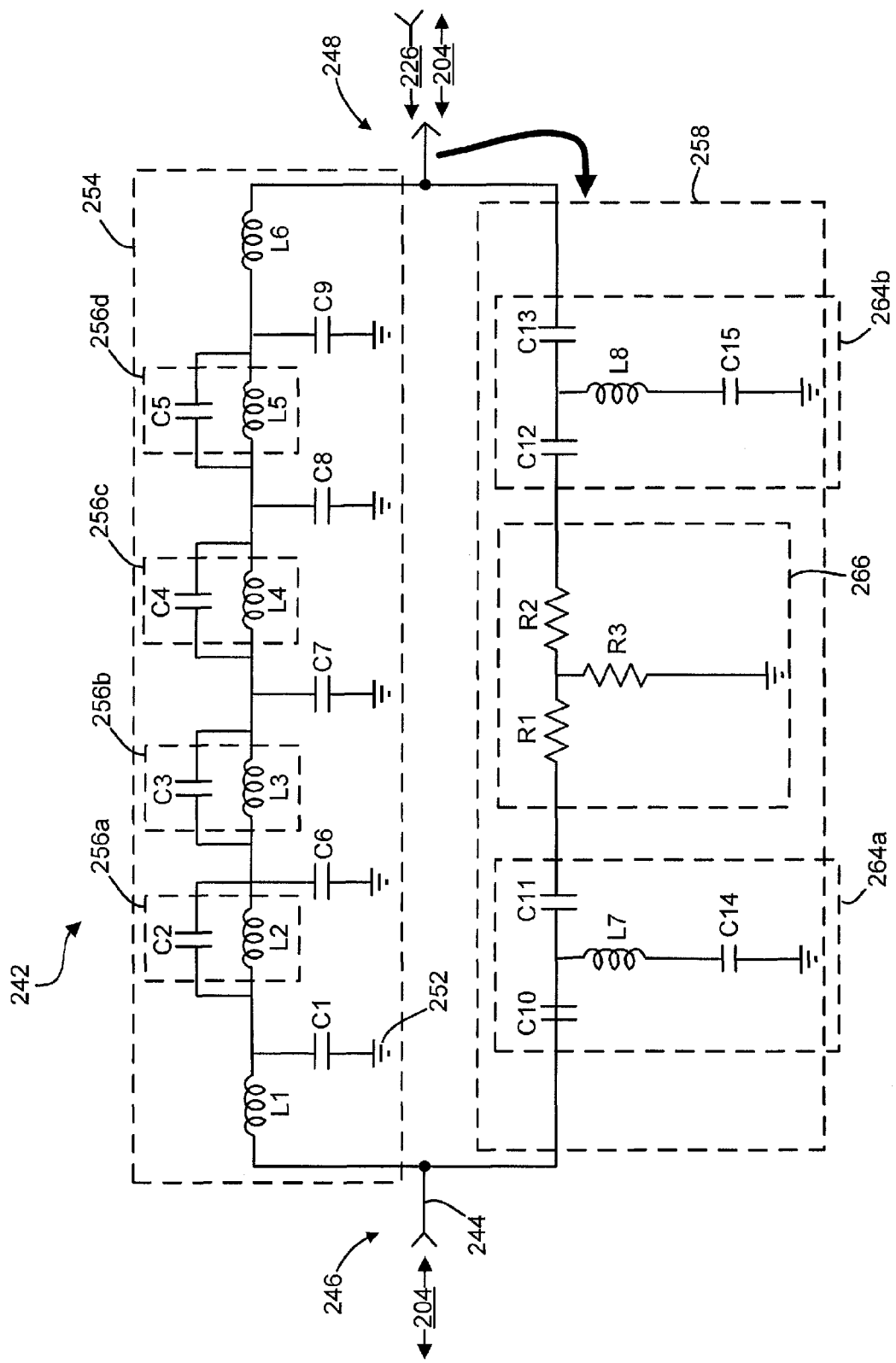
FIG. 5 is a circuit diagram, in schematic form, of a second embodiment of a filter in accordance with the present invention.

Referring now to FIG. 5 of the drawings, wherein like numerals indicate like elements from FIGS. 1 and 2, another topology of an improved filter circuit 242 is provided that reduces the multipath interference experienced with prior MoCA filters. The filter circuit 242 includes a signal path 244 extending from an input 246 to an output 248. In one example, the input 246 is connected to the input port of the coaxial cable connector, which may be, in turn, in electrical communication with a supplier-side port such as a tap port (not shown). The output 248 may be adapted to receive signals comprising the provider bandwidth 204, the home network bandwidth 226, noise, and any other signals present on the coaxial cable. Conversely, the input 246 may be connected to the user-side port and the output 248 may be connected to the supplier-side port. Further, the filter circuit 242 may be adapted to filter signals in both directions (e.g., bi-directional), so the physical location of the input 246 and output 248 may be arbitrary.

The signal path 244 includes a conductive path 250, such as the center conductor in a coaxial cable, to carry the upstream bandwidth, the downstream bandwidth, and the home network bandwidth. The signal path 244 further includes a ground 252, such as the outer sheath of the coaxial cable that provides a path to ground with various cable connector devices.

The filter circuit 242 further includes a pass band filter portion 254 disposed along the signal path 244 between the input 246 and the output 248. The pass band filter portion 254 is configured to pass a first frequency spectrum in the provider bandwidth 204 and attenuate a second frequency spectrum in the home network bandwidth 226. In this manner, the pass band filter portion 254 is a low pass filter. In one embodiment, the pass band filter portion 254 is a parallel inductor/capacitor (LC) arrangement in which inductors L1 and L6 increase the isolation of the low pass filter. Resonator or tank elements 256a-256d defined by L2/C2, L3/C3, L4/C4, and L5/C5 and capacitive shunts C1, C6, C7, C8, and C9 collectively form an elliptic filter. Other filter designs, such as Butterworth, are equally operable but may require additional components to implement.

The filter circuit 242 further includes a multipath interference mitigation leg 258 operatively branched to ground from the signal path 244. The multipath interference mitigation leg 258 is configured to increase the return loss in the home network bandwidth. In the embodiment shown in FIG. 5, the multipath interference mitigation leg 258 is an attenuator circuit that increases the return loss at the output port of the connector without affecting the frequency response of the remaining circuit. The attenuator circuit includes a high pass filter portion 264a, 264b and an attenuator portion 266. The high pass filter portions 264a, 264b are Tee-type circuits in one example, but may comprise other types. In the disclosed embodiment, the attenuator portion 266 is a Tee-type resistive attenuator comprising three resistors R1, R2, and R3. However, other arrangements are contemplated, such as a Pi-attenuator.

Figure 6:
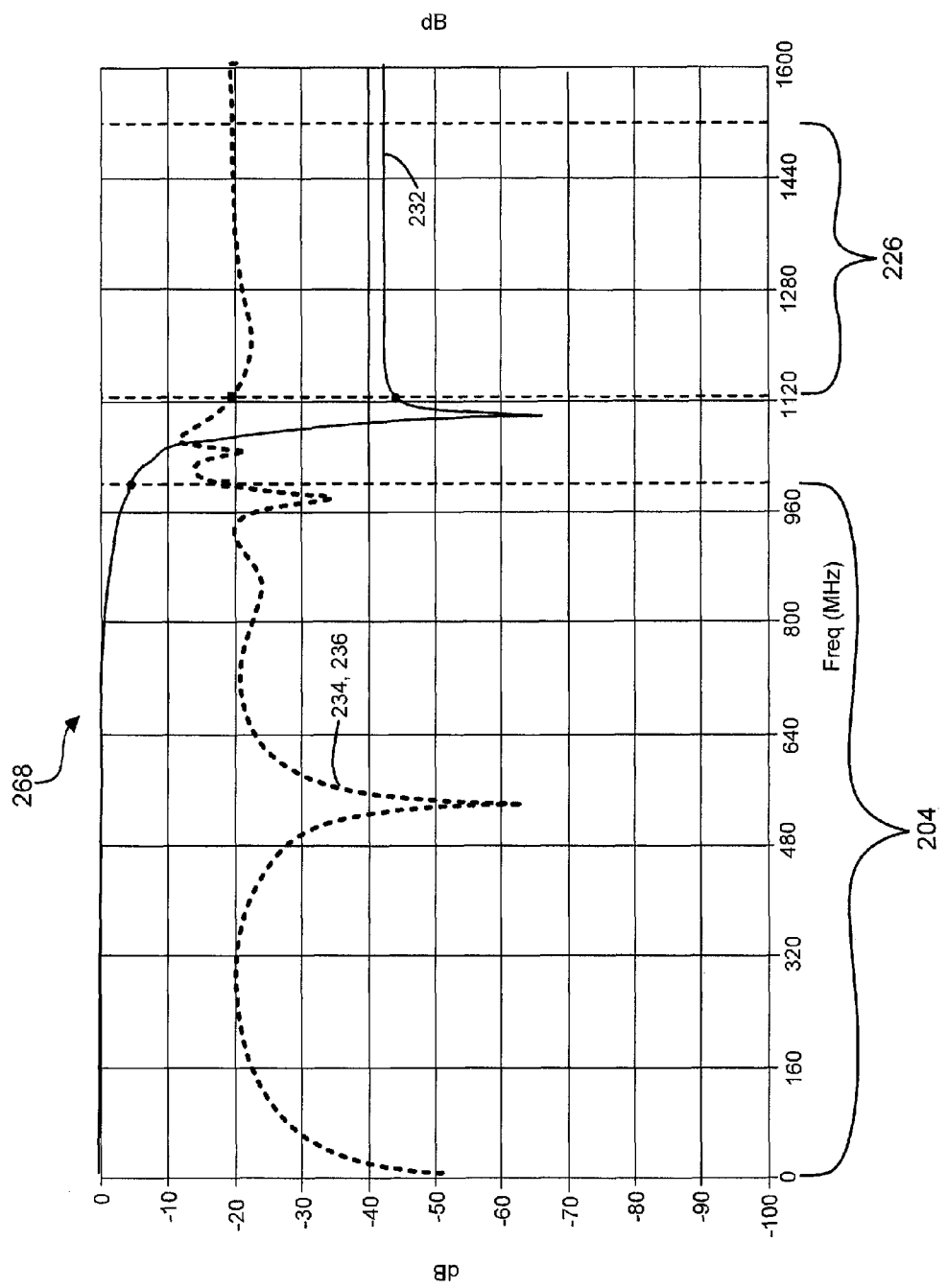
FIG. 6 is a chart showing the insertion loss and input/output return loss for the filter circuit shown in FIG. 5.

FIG. 6 plots the frequency response 268 of the filter circuit 242 shown in FIG. 5. The insertion loss 232 between the connector input and the connector output is essentially zero in the provider bandwidth 204, and greater than 40 dB in the home network bandwidth 226. Thus, the filter circuit 242 will pass the signals in the provider bandwidth 204 and attenuate the signals in the home network bandwidth 226. The input return loss 234 and output return loss 236 are essentially identical due to the symmetry of the circuit, and comprise a value of greater than 20 dB in both the provider bandwidth 204 and the home network bandwidth 226. In this manner, reflections at the input port and output port are reduced, and the strength of the secondary transmission path (described in FIG. 1) will be reduced by as much as 99%.

One advantage provided by the present invention is that home network multipath distortions at the filter port connections are minimized or even eliminated, thereby enhancing signal quality. Prior art filters designed for the MoCA standard, for example, generated significant multipath distortions from the poor return loss (typically less than 1 dB) produced from the filter's stop band.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. For example, although the embodiments disclosed herein comprise analog circuits, the inventors contemplate digital circuitry could be utilized without departing from the scope of the invention. Further, although specific terms are employed herein, they are used in a generic and descriptive sense only and not for purposes of limitation.

We claim:

1. A filter circuit having a frequency response, the filter circuit comprising:
   a signal path extending from an input to an output, the signal path comprising a conductive path and a ground;
   a pass band filter portion disposed along the signal path between the input and the output, the pass band filter portion configured to pass a first frequency spectrum in a provider bandwidth and attenuate a second frequency spectrum in a home network bandwidth, wherein the pass band filter portion comprises a hybrid parallel inductor/capacitor arrangement having tank elements and isolation inductors; and
   a multipath interference mitigation leg operatively branched from the signal path, the multipath interference mitigation leg configured to decrease multipath distortions by improving a return loss characteristic of the home network bandwidth;
   wherein the frequency response is characterized by an insertion loss characteristic between the input and the output being less than 3 decibels (dB) in the provider bandwidth and more than 20 dB in the home network bandwidth, the frequency response further characterized by a return loss characteristic at the output being more than 10 dB in the provider bandwidth and more than 20 dB in the home network bandwidth.

2. The filter circuit of claim 1, wherein the frequency response is further characterized by the insertion loss characteristic being more than 30 dB in the home network bandwidth.

3. The filter circuit of claim 1, wherein the multipath interference mitigation leg is terminated to the ground.

4. The filter circuit of claim 1, wherein the multipath interference mitigation leg comprises an absorptive portion.

5. The filter circuit of claim 4, wherein the absorptive portion comprises a Chebyshev filter circuit.

6. The filter circuit of claim 5, wherein the Chebyshev filter circuit comprises a plurality of Chebyshev filter circuits.

7. The filter circuit of claim 1, wherein the multipath interference mitigation leg further comprises a shunt resistor.

8. The filter circuit of claim 7, wherein the provider bandwidth has a characteristic impedance of 75 ohms, and the shunt resistor has a resistance value of about 75 ohms.

9. The filter circuit of claim 1, wherein the provider bandwidth is provided by a provider group.

10. The filter circuit of claim 9, wherein the provider group is selected from a group consisting of a cable provider, a satellite provider, and a telecommunications provider.

11. The filter circuit of claim 10, wherein the provider bandwidth comprises a frequency range of 5 megahertz to 1002 megahertz.

12. The filter circuit of claim 1, wherein the home network bandwidth is provided by an end user.

13. The filter circuit of claim 12, wherein the home network bandwidth is selected from a group consisting of Ethernet, HomePlug, HPNA, 802.11n, and MoCA.

* * * * *